United States Patent [19]
Naito

[11] Patent Number: 5,750,439
[45] Date of Patent: May 12, 1998

[54] METHOD OF MAKING ALUMINUM ALLOY WIRING WITH LESS SILICON NODULE

[75] Inventor: Masaru Naito, Hamamatsu, Japan

[73] Assignee: Yamaha Corporation, Shizuoka, Japan

[21] Appl. No.: 624,873

[22] Filed: Mar. 27, 1996

[30] Foreign Application Priority Data

Mar. 29, 1995 [JP] Japan .................. 7-096121

[51] Int. Cl.$^6$ .................................. H01L 21/28
[52] U.S. Cl. .................. 438/648; 438/656; 438/658; 438/661; 438/669; 438/688
[58] Field of Search .................. 437/190, 192, 437/194, 189, 195, 203, 247, 199; 438/648, 656, 658, 661, 669, 688

[56] References Cited

U.S. PATENT DOCUMENTS

| | | |
|---|---|---|
| 4,970,176 | 11/1990 | Tracy et al. . |
| 5,036,382 | 7/1991 | Yamaha . |
| 5,238,874 | 8/1993 | Yamada . |
| 5,266,521 | 11/1993 | Lee et al. . |
| 5,289,035 | 2/1994 | Bost et al. . |
| 5,305,519 | 4/1994 | Yamamoto et al. . |
| 5,356,836 | 10/1994 | Chen et al. ............. 437/190 |
| 5,360,995 | 11/1994 | Graas . |
| 5,470,790 | 11/1995 | Myers et al. ............. 437/194 |
| 5,504,043 | 4/1996 | Ngan et al. ............. 437/192 |

FOREIGN PATENT DOCUMENTS 62-239553  10/1987  Japan .
5-190551   7/1993   Japan .

OTHER PUBLICATIONS

S. Wolf, "Silicon Processing for the VLSI Era, vol. 2", Lattice Press, p. 128, 1990.

Primary Examiner—John Niebling
Assistant Examiner—Thomas G. Bilodeau

[57] ABSTRACT

After a contact hole is formed in an insulating film covering the surface of a semiconductor substrate, a Ti layer and a TiON (or TiN) layer are sequentially formed on the insulating film. On the TiON layer an Al alloy layer 18 containing Si is formed, and a reflow thermal treatment is performed after or during the formation of the Al alloy layer in order to improve step coverage. During this thermal treatment, Si nodules are generated. After a Ti layer is formed on the reflowed Al alloy layer, an annealing thermal treatment is performed for 120 seconds at a temperature of 450° to 500° C. With this thermal treatment, Si of Si nodules is absorbed in the Ti layer so that Si nodules are reduced or extinguished. After an antireflection TiN (or TiON) layer is formed on the Ti layer, wiring patterns are formed by using resist patterns as a mask. Since Si nodules are extinguished, wiring resistance can be reduced and an etching time can be shortened.

29 Claims, 6 Drawing Sheets

METHOD OF MAKING ALUMINUM ALLOY WIRING WITH LESS SILICON NODULE

BACKGROUND OF THE INVENTION a) Field of the Invention

The present invention relates to a method of manufacturing a semiconductor device such as LSI, and more particularly to a method of manufacturing a semiconductor device suitable for forming a fine wiring pattern.

b) Description of the Related Art

Figure 4A:
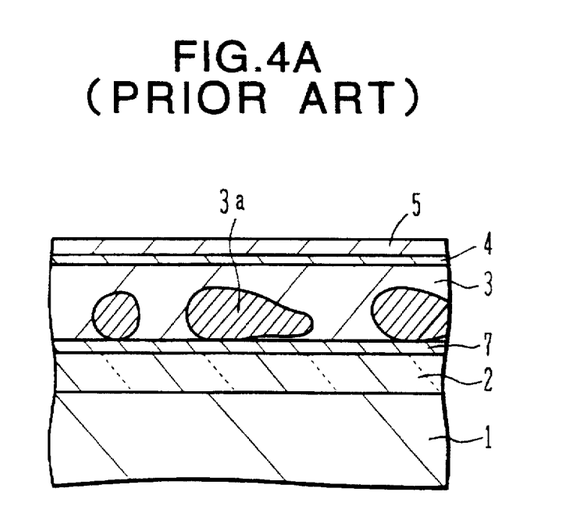
Figure 4B:
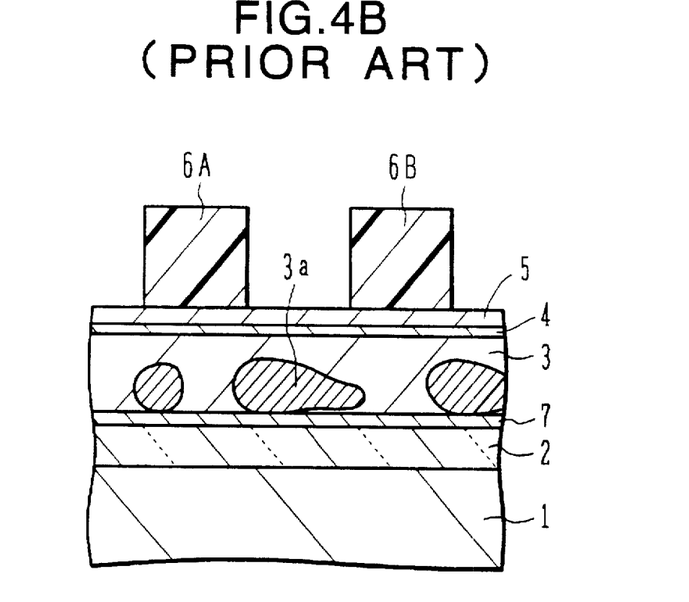
Figure 4C:
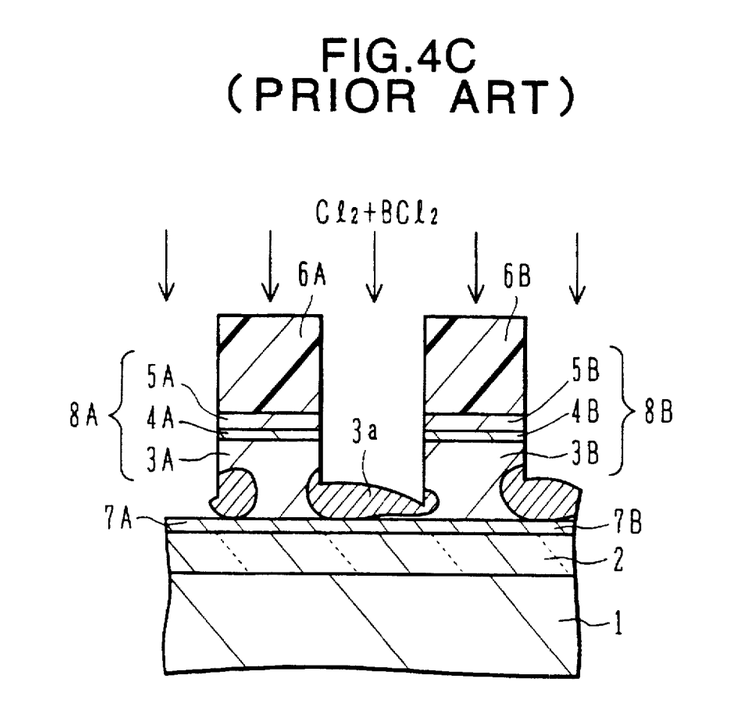

A conventional method of forming a wiring pattern of LSI or other devices is illustrated in FIGS. 4A to 4C (e.g., Japanese Patent Laid-open Publication No. 5-190551).

At a process shown in FIG. 4A, on an insulating film 2 covering the surface of a semiconductor substrate 1, a barrier metal layer 7 and an Al alloy layer 3 containing Si (e.g., Al—Si—Cu alloy) are formed and thereafter, a Ti layer 4 and a TiN layer 5 are sequentially formed by sputtering. The interlayer insulating film 2 has a connection hole (not shown) to expose the substrate surface. The Al alloy layer 3 forms an ohmic contact with the exposed substrate surface. The barrier layer 7 blocks interdiffusion between the substrate 1 and the Al alloy layer 3. The Ti layer 4 prevents the surface of the Al alloy layer 3 from being nitrogenized while the TiN layer 5 is formed through reactive sputtering. Therefore, an increase of contact resistance between the Al alloy layer 3 and an upper level wiring layer can be avoided. The TiN layer 5 prevents light reflection during photolithography.

At the next process shown in FIG. 4B, resist patterns 6A and 6B are formed by photolithography, the resist patterns being used as an etching mask when desired wiring patterns are formed.

Thereafter, at the process shown in FIG. 4C, by using the resist patterns 6A and 6B as an etching mask, a laminate of the TiN layer 5, Ti layer 4, Al alloy layer 3, and barrier layer 7 is patterned to form wiring patterns 8A and 8B through dry etching using $Cl_2+BCl_2$ as etching gas. The wiring pattern 8A is formed of residual portions 5A, 4A, 3A, and 7A respectively of the TiN layer 5, Ti layer 4, Al alloy layer 3, and barrier layer 7. The wiring pattern 8B is formed of residual portions 5B, 4B, 3B, and 7B respectively of the TiN layer 5, Ti layer 4, Al alloy layer 3, and barrier layer 7. The resist patterns 6A and 6B are removed thereafter.

In order to improve step coverage of the Al alloy layer 3 at a contact hole (not shown) in the insulating film 2, a thermal treatment at a substrate temperature at 450° C.–500° C. is performed following the deposition of Al alloy, such as by so-called thermal sputtering of the Al alloy layer 3 with heat being applied during sputtering and by so-called reflow with heat being applied after sputtering. However, during such a thermal treatment, Si in the Al alloy layer 3 precipitates and grows as Si nodules (lumps of excessive Si) 3a having a large grain diameter such as shown in FIGS. 4A to 4C.

Si nodules 3a increase the wiring resistance by its high resistivity. At the patterning process illustrated in FIG. 4C, the etching rate of Si nodules 3a is slower than that of the Al alloy layer 3. Therefore, the etching time is required to be prolonged. If the etching time is short, part of Si nodules 3a is left unetched as shown in FIG. 4C and the wiring patterns 8A and 8B may be short-circuited in some cases.

SUMMARY OF THE INVENTION

It is an object of the present invention to provide a novel method of forming a wiring pattern capable of extinguishing Si nodules.

According to one aspect of the present invention, there is provided a method of manufacturing a semiconductor device comprising the steps of: forming an Al alloy layer containing Si on a surface of a semiconductor substrate having a step; heating and reflowing the Si containing Al alloy layer; forming a Ti layer on the reflowed Si containing Al alloy layer; and annealing the semiconductor substrate at a temperature allowing Si in the Si containing Al alloy layer to migrate.

A thermal treatment is performed after the Ti layer is formed so that excessive Si in the Al alloy layer can be absorbed in the Ti layer and that Si nodules in the Al alloy layer generated by a preceding thermal process can be reduced or extinguished.

According to another aspect of the present invention, there is provided a method of manufacturing a semiconductor device comprising the steps of: forming an insulating film covering the surface of a semiconductor substrate having a contact area forming a contact hole in the insulating film at an area corresponding to the contact area of the semiconductor substrate; forming an Si containing Al alloy layer covering the insulating film and the contact hole, and performing a thermal treatment after or during the formation of the Si containing Al alloy to improve step coverage at the contact hole; forming a Ti layer on the Al alloy layer after the thermal treatment; performing another thermal treatment to absorb excessive Si in the Al alloy layer into the Ti layer; forming an antireflection layer of TiN or TiON on the Ti layer; forming a mask pattern having a desired wiring pattern on the antireflection layer by photolithography; and selectively etching a laminate of the antireflection layer, the Ti layer, and the Al alloy layer by using the mask pattern to form a wiring pattern connected to the contact area via said contact hole.

Si nodules may be generated in the Al alloy layer containing Si during a thermal treatment for improving step coverage. After the Ti layer is formed on the Al alloy layer, a thermal treatment is performed to reduce the size of Si nodules in the Al alloy layer containing Si or extinguish them. It is therefore possible to suppress short circuits between wiring patterns and an increase of wiring resistance and to shorten the etching time of wiring patterning.

BRIEF DESCRIPTION OF THE DRAWINGS

FIGS. 1A to 1F are cross sectional views of a substrate illustrating the main processes of a method of manufacturing a semiconductor device according to an embodiment of the invention: wherein FIG. 1A illustrates a TiON/Ti deposition process; FIG. 1B illustrates an Al alloy deposition process; FIG. 1C illustrates an Al alloy reflow process; FIG. 1D illustrates a Ti deposition process and a thermal treatment process; FIG. 1E illustrates a TiN deposition process and a resist layer forming process; and FIG. 1F illustrates a wiring pattern forming process.

FIGS. 4A to 4C are cross sectional views of a substrate illustrating a conventional method of forming a wiring pattern: FIG. 4A illustrates a wiring material deposition process and a thermal treatment; FIG. 4B illustrates a resist layer forming process; and FIG. 4C illustrates a wiring layer patterning process.

DETAILED DESCRIPTION OF THE PREFERRED EMBODIMENTS

FIGS. 1A to 1F illustrate a method of forming a wiring pattern according to an embodiment of the invention. The processes (1) to (6) corresponding to FIGS. 1A to 1F will be described in this order.

Figure 1A:
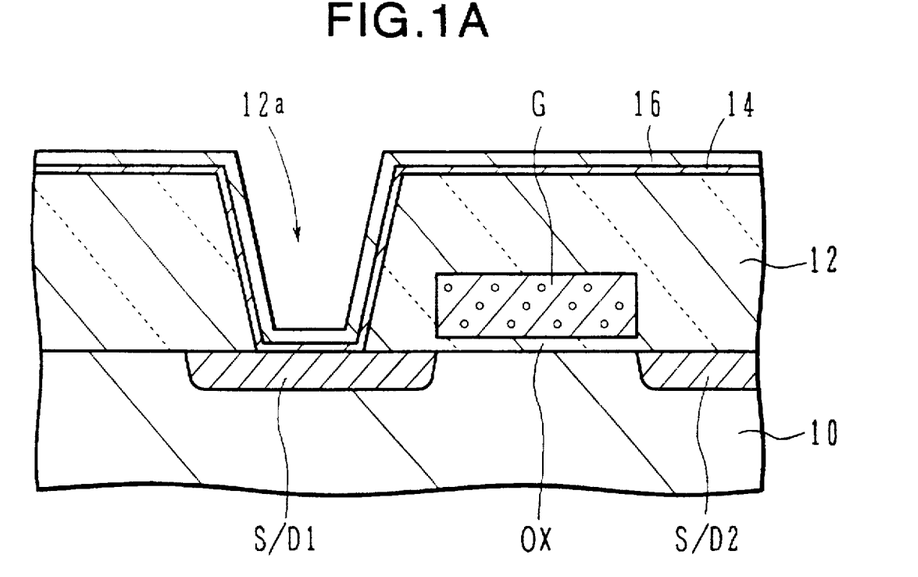

(1) As shown in FIG. 1A, on the surface of a substrate 10 formed of p-type silicon, a gate insulating film OX is formed. On the surface of the gate insulating film OX, an insulated gate G is formed and a pair of n-type source and drain regions S/D 1 and S/D 2 are formed on both sides of the insulated gate G to thus form a MOS transistor structure. An insulating film 12 of borophosphosilicate glass (BPSC) is formed over the substrate surface, covering the MOS transistor structure, by chemical vapor deposition (CVD). A contact hole 12a is formed in the insulating film 12 by known photolithography and etching process, the contact hole 12a reaching an impurity doped contact area such as the source/drain region S/D in the substrate surface.

A Ti layer 14 and a TiON layer 16 are sequentially formed on the insulating film 12, covering the surface of the contact hole. For example, the layers 14 and 16 were sequentially formed through sputtering by using a clustered system having a plurality of sputter chambers coupled through a transport chamber. The pressure in each sputtering chamber before sputtering was set to $10^{-8}$ Torr, and the layers 14 and 16 were deposited to the thicknesses of 20 nm and 100 nm respectively. The Ti layer 14 functions to reduce contact resistance, and the TiON layer 16 is a barrier layer.

Figure 1B:
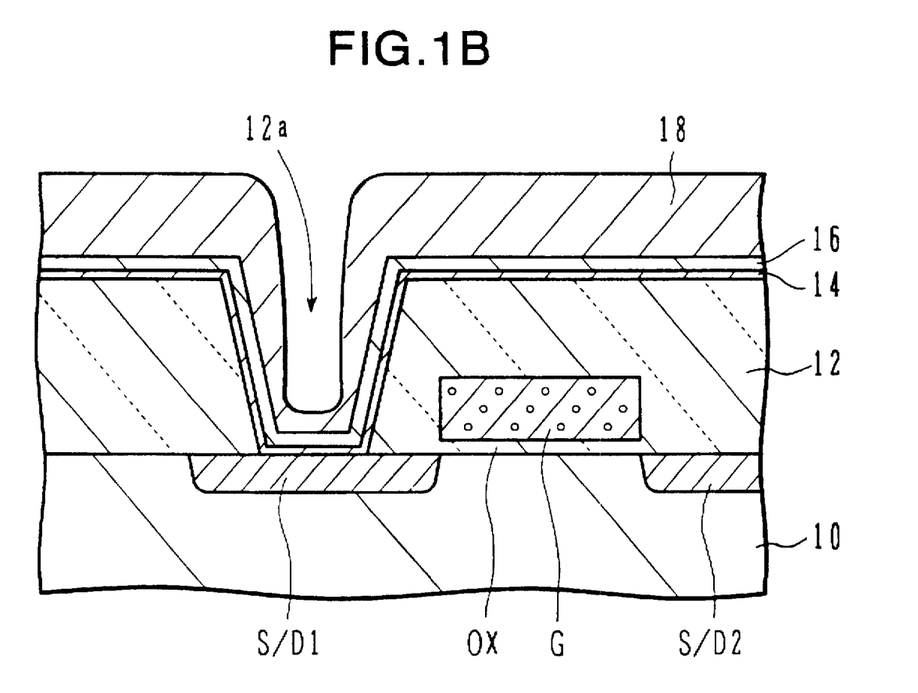

(2) As shown in FIG. 1B, an Al alloy layer 18 containing Si is formed on the TiON layer 16, covering the contact hole 12a. For example, without releasing the vacuum state in the cluster system at the process (1), an Al—Si—Cu alloy layer 18 was formed in another process chamber to a thickness of 400 um through sputtering. In this state, step coverage of the Al alloy layer 18 is insufficient at the contact hole 12a. Al—Si alloy may also be used in place of Al—Si—Cu alloy.

Figure 1C:
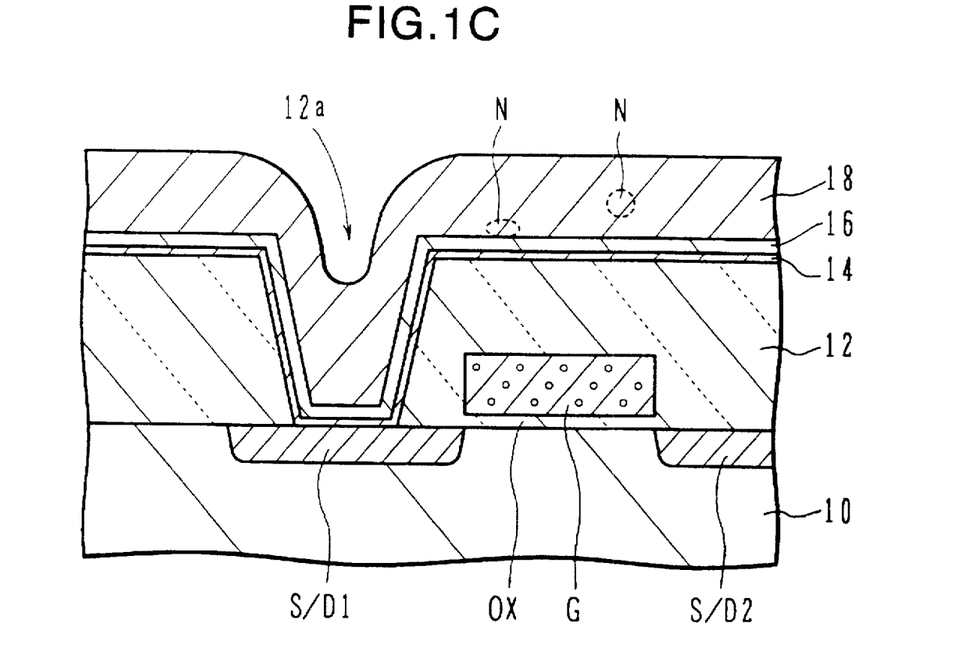

(3) As shown in FIG. 1C, in order to improve the step coverage of the Al alloy layer 18, a reflow process is performed at a temperature T1. For example, without releasing the vacuum state in the cluster tool at the process (2), the reflow process was performed after sputtering in another reflow process chamber by heating the Al alloy layer 18 to a temperature T1 of 450° C. to 500° C. This heating may be performed at the same time when the sputtering process is performed. With this thermal treatment, the step coverage of the Al alloy layer 18 improves. However, since Si in the Al alloy layer 18 migrates, Si nodules N are prone to be formed in the Al alloy layer 18.

Figure 1D:
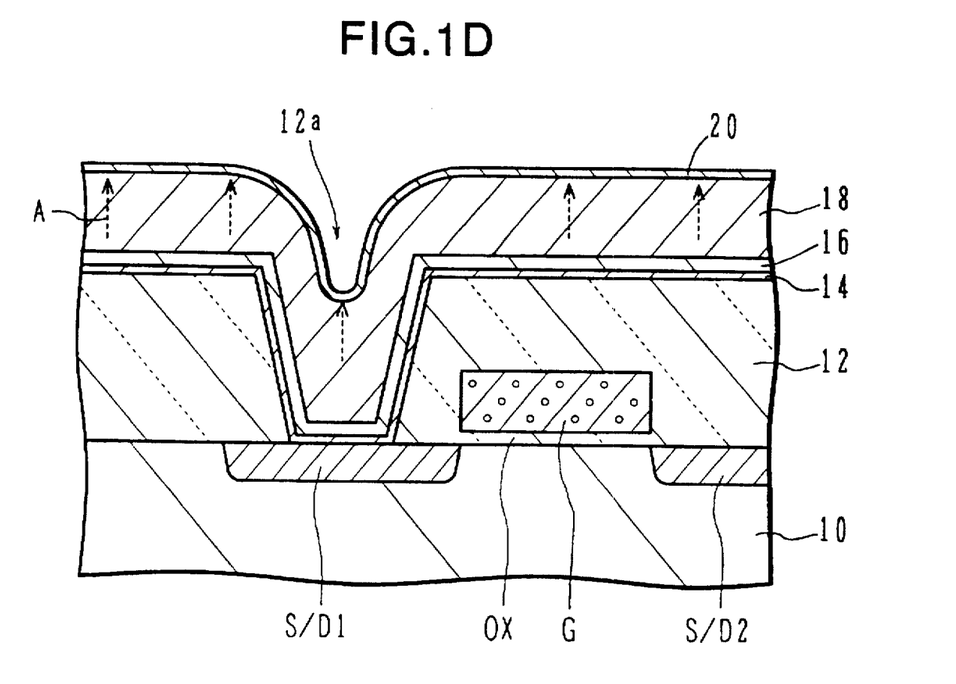

(4) As shown in FIG. 1D, a Ti layer 20 is formed on the Al alloy layer 18, covering the contact hole 12a. For example, without releasing the vacuum state in the cluster system at the process (3), the Ti layer 20 was formed in another process chamber to a thickness of 7 nm through sputtering.

The Ti layer 20 absorbs excessive Si in the Al alloy layer 18 and prevents the surface of the Al alloy layer 18 from being nitrogenized.

Next, a thermal treatment (sintering) is performed at a temperature T2 in order to the Ti layer 20 to absorb excessive Si in the Al alloy layer 18, as shown in arrows A in FIG. 1D. Preferably, T2 is set to about 450°–500° C. For example, without releasing the vacuum state in the process chamber in which the Ti layer was formed, a thermal treatment was performed for 120 seconds at 470° C. This temperature of the thermal treatment should allow migration of Si in the Al alloy layer 18, and is preferably set higher than the reflow temperature in order to reduce and consume Si nodules once generated. It is preferable to satisfy the relation, T1≦T2<melting point of the Al alloy. It is further preferable that the anneal temperature T2 is selected near the reflow temperature, for example T2−T1≦20° C.

Figure 1E:
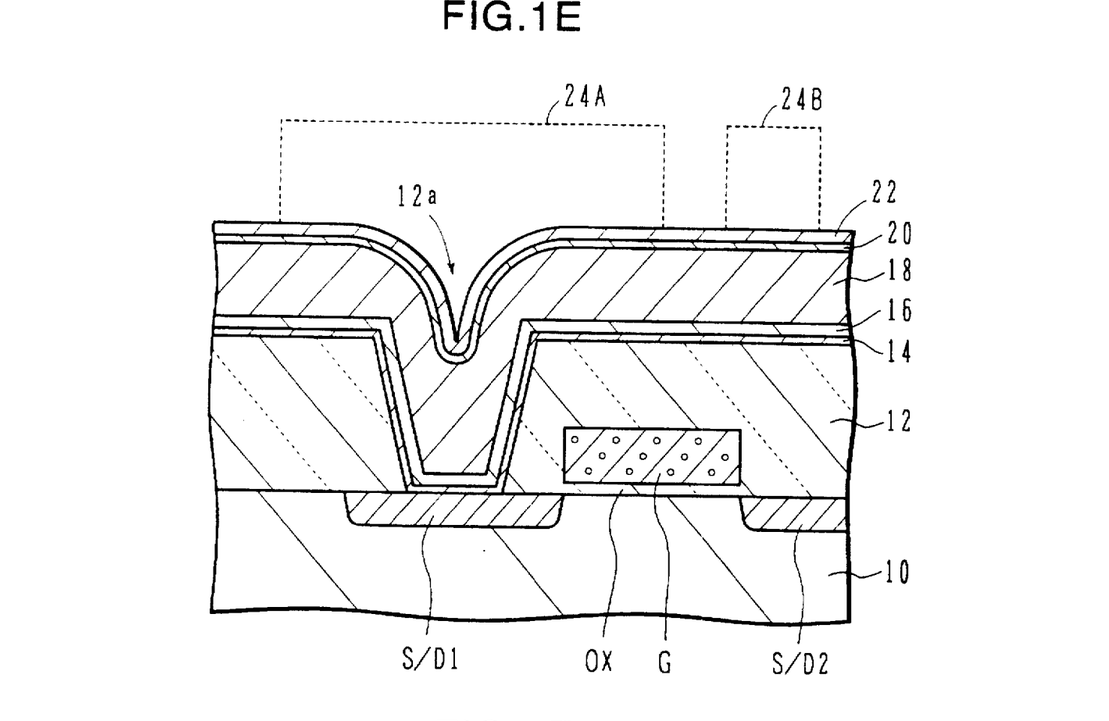

(5) As shown in FIG. 1E, a TiN layer 22 is formed on the surface of the Ti layer 22, covering the contact hole 12a. For example, without releasing the vacuum state in the cluster system at the process (4), the TiN layer 22 was formed in another process chamber to a thickness of 40 nm through reactive sputtering. Since the surface of the Al alloy layer 20 is covered with the Ti layer, the Al alloy layer 20 will not be nitrogenized. Accordingly, an increase of the contact resistance between the Al alloy layer 20 and a higher level wiring layer can be avoided.

Examples of conditions for forming the Al alloy layer, Ti layer, TiN layer and TiON layer are as follows. The Al alloy layer may be deposited at a substrate temperature of 150° C. using an Al alloy target containing 1.0 weight % of Si, and 0.5 weight % of Cu. The Ti layers may be deposited by sputtering a Ti target with Ar gas. The TiON layer may be deposited by reactive sputtering using a Ti target and an atmosphere formed by supplying Ar, $N_2$ and $O_2$ at a ratio of flow rates of 3:9:1. The TiN layer may be deposited by reactive sputtering using a Ti target and an atmosphere formed by supplying Ar and $N_2$ at a ratio of flow rates of 1:2.

Resist patterns 24A and 24B having desired wiring patterns are formed over the substrate surface by known photolithography. In this photolithography process, the TiN layer 22 functions as an antireflection film.

Figure 1F:
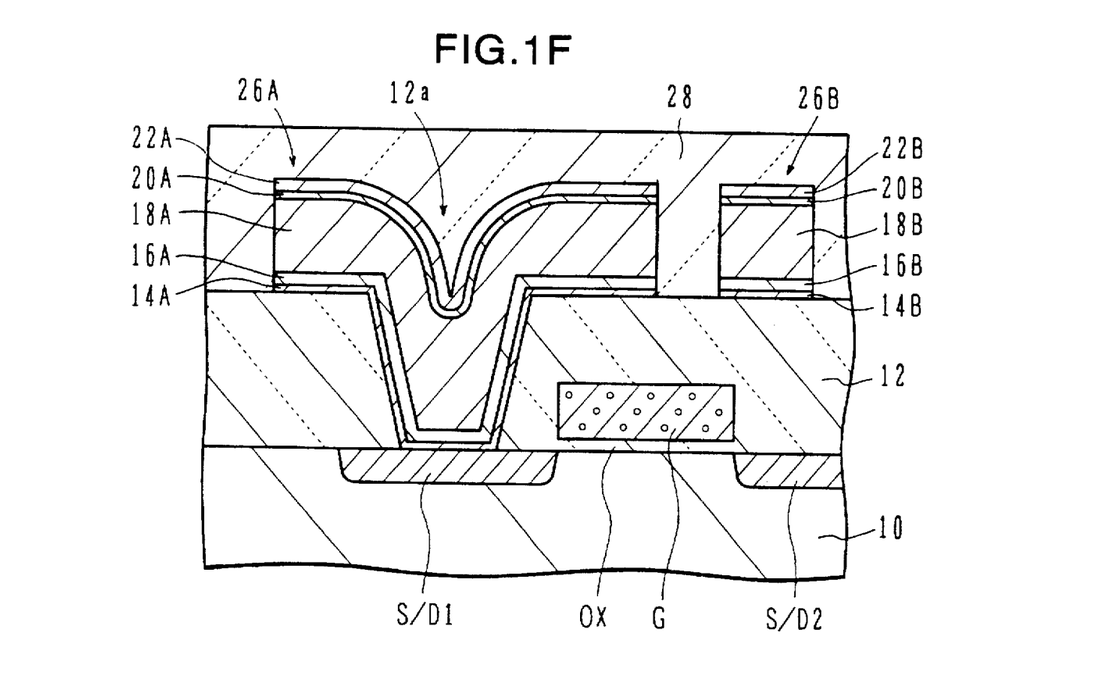
Figure 2:
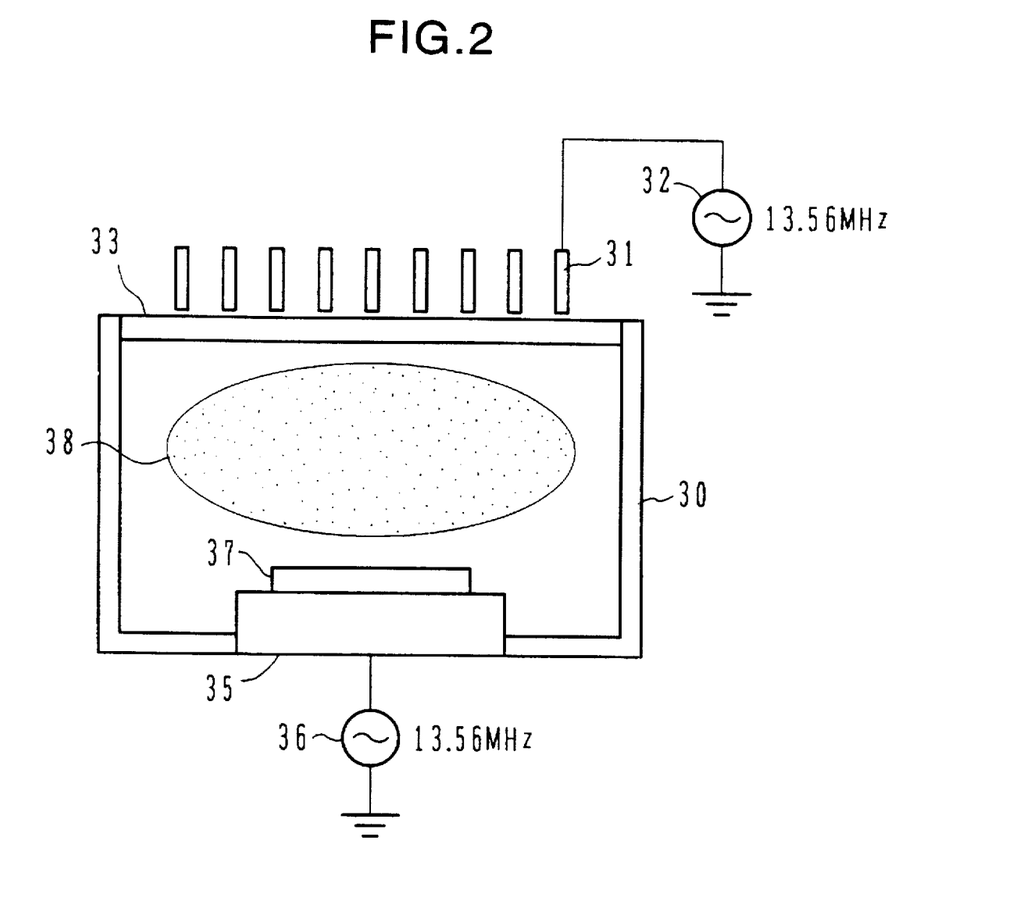
FIG. 2 is a schematic cross-sectional view of an inductively coupled plasma etching apparatus.

(6) As shown in FIG. 1F, by using the resist patterns 24A and 24B as a mask, a laminate of the layers 14, 16, 18, 20, and 22 is patterned through selective dry etching to form wiring patterns 26A and 26B. The wiring pattern 26A is formed of residual portions 14A, 16A, 18A, 20A, and 22A respectively of the layers 14, 16, 18, 20, and 22. The wiring pattern 26B is formed of residual portions 14B, 16B, 18B, 20B, and 22B respectively of the layers 14, 16, 18, 20, and 22. The dry etching may be done in an inductively coupled plasma etching chamber as shown in FIG. 2. An inductive coil 31 connected to a radio frequency (RF) power source 32 of 13.56 MHz is disposed above a dielectric plate 33 which constitute part of a vacuum chamber 30. A bottom electrode 35 connected to another RF source 36 of 13.56 MHz also constitute part of the vacuum chamber 30 and carries a wafer 37. A plasma 38 is generated by RF power supplied from the inductive coil 31 (top) and from the bottom electrode 35 (bottom). The dry etching conditions are, for example, such as shown in Table 1.

TABLE 1

| | Pressure [mTorr] | Gas Flow [sccm] | High Frequency Power [W] |
|---|---|---|---|
| Main Etching | 15 | $Cl_2$: 40<br>$BCl_3$: 20 | Top: 350<br>Bottom: 175 |
| TiON Etching | 10 | $Cl_2$: 30<br>$BCl_3$: 30 | Top: 340<br>Bottom: 125 |

"Main Etching" means etching of the Al alloy layer 18, and "TiON Etching" means etching of the TiON layer 16 and Ti layer 14. These etching processes are continuously performed in the same etching chamber. After etching, the resist patterns 24A and 24B are removed. Thereafter, an insulating layer 28 is formed over the substrate surface, covering the wiring patterns 26A and 26B.

The wiring layer after Ti deposition and before the annealing (thermal) treatment was observed. It was found that Si nodules having a diameter of about 1.0 μm were distributed. When the wiring layer covered with the Ti layer and subjected to an annealing (thermal) treatment at a substrate temperature of 450° C. in $H_2$ atmosphere was observed. It was confirmed that the Si nodules having a diameter of about 1.0 μm were annihilated or at least diminished.

Figure 3:
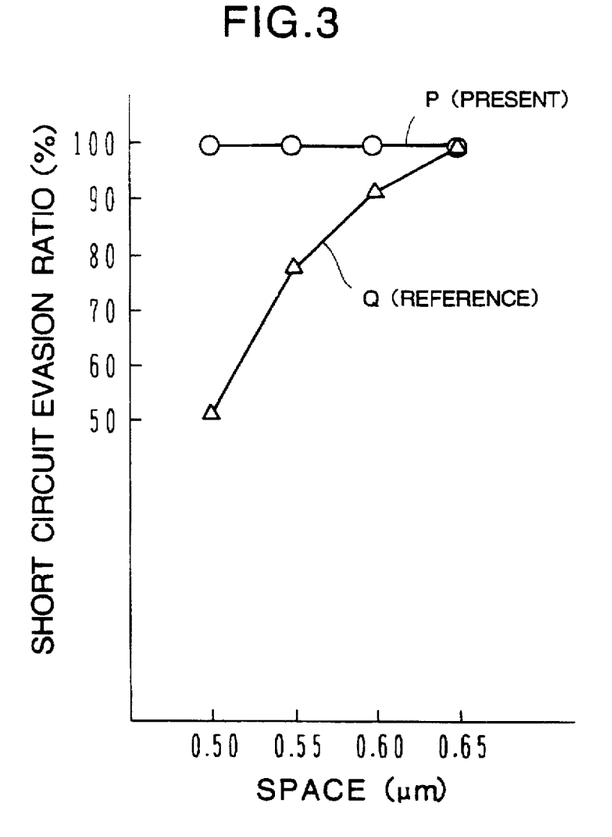
FIG. 3 is a graph showing a relationship between the distance (space) between wiring patterns and a short circuit evasion ratio, with a thermal treatment after forming a TiN layer of the embodiment and without a thermal treatment like conventional technique.

FIG. 3 is a graph showing a relationship between the distance (space) between wiring patterns and a short circuit evasion ratio, with a thermal treatment after forming the Ti layer 20 of the embodiment and without this thermal treatment like conventional technique. The processes of forming embodiment samples and comparison samples are the same as described with FIGS. 1A to 1F, excepting the presence/absence of the thermal treatment after forming the Ti layer. The etching time at the wiring layer patterning process of FIG. 1F was set to such a time as the conductive material is not left between the wiring patterns 26A and 26B in the embodiment method. The short circuit evasion ratio indicates what % of a predetermined number of samples evaded short circuits such as the shorted region 3a of FIG. 3C. Lines P and Q indicate space dependencies of the short circuit evasion ratio of the embodiment samples and comparison samples, respectively.

As seen from the graph of FIG. 3, at the space of 0.5 μm, generation of short circuits of this embodiment can be suppressed by 100% even when the comparison samples have short circuits of 50% of the total samples.

In the above embodiment, a TiN layer may be used in place of the TiON layer 16, and a TiON layer may be use din place of the TiN layer 22. The thickness of the Ti layer 20 may be set to about 5 to 10 nm, and the thicknesses of other layers 16, 18, and 22 are not limited to the above values but may be set as desired.

The thermal treatment time after forming the Ti layer 20 is not limited to 120 seconds.

In the above embodiment, a thermal treatment is performed prior to the formation of the TiN layer 22 in order for the Ti layer 20 to absorb excessive Si in the Al alloy layer 18. This thermal treatment may be performed in a sputtering chamber, or by using another thermal treatment system.

In the above embodiment, a first metal wiring layer on a MOS transistor has been described by way of example. In a semiconductor device having high and low level metal wiring layers, the high level metal wiring layer may also be formed by the above processes. In this case, the contact area of the Si substrate is replaced by contact areas of the Si substrate, or low level wiring layer, and the like. Contact to the gate electrode may also be performed by the above processes.

The present invention has been described in connection with the preferred embodiments. The invention is not limited only to the above embodiments. It is apparent to those skilled in the art that various substitutions, modifications, changes, combinations and the like can be made without departing from the scope of the appended claims.

I claim:

1. A method of manufacturing a semiconductor device comprising the steps of:

(a) forming an Al alloy layer containing Si on a surface of a semiconductor substrate having a step;

(b) heating and reflowing said Si containing Al alloy layer;

(c) forming a Ti layer on said reflow Si containing Al alloy layer;

(d) after step (c), annealing said semiconductor substrate at a temperature sufficient to consume any Si precipitates which may have been generated during said heating and reflowing step in said Si containing Al alloy layer; and (e) after the annealing step, patterning said Si containing Al alloy layer in which Si precipitates are consumed, and said Ti layer.

2. A method according to claim 1, wherein a temperature of said annealing step is higher than a temperature of said reflowing step.

3. A method according to claim 2, wherein the temperature of said reflowing step is in a range from 450° C. to 500° C.

4. A method according to claim 1, wherein said annealing step is performed in a temperature range from 450° C. to 500° C.

5. A method according to claim 1, wherein said semiconductor substrate has on its surface a MOS transistor structure and an insulating film disposed thereon and having an opening exposing part of said MOS transistor structure.

6. A method according to claim 5, further comprising the step of forming another Ti layer, and a TiN or TiON layer on the surface of said semiconductor substrate, before said step of forming an Si containing Al alloy layer.

7. A method according to claim 5, further comprising the steps of, after said annealing step:

forming an antireflection film on said Ti layer;

forming a resist pattern on said antireflection film; and etching said antireflection film, Ti layer, and Si containing Al alloy layer by using said resist pattern as an etching mask to form a wiring pattern.

8. A method according to claim 7, wherein said antireflection film is made of TiN or TiON.

9. A method according to claim 7, further comprising the step of forming an insulating layer covering said wiring pattern.

10. A method according to claim 1, wherein said Si containing Al alloy layer forming step and said reflowing step are carried out at the same time.

11. A method of manufacturing a semiconductor device, comprising the steps of:

a) providing an aluminum alloy layer over a substrate having a hole;

b) fluidizing the aluminum alloy layer to reflow aluminum alloy into the hole;

c) forming a titanium layer on the aluminum alloy layer; and d) after step (c), annealing the substrate to eliminate silicon precipitates which may have been generated during step (b) from the aluminum alloy layer; and e) patterning the aluminum alloy layer from which the silicon precipitates are eliminated, and the titanium layer.

12. A method according to claim 11, wherein the aluminum alloy layer comprises a material selected from a group consisting of Al—Si—Cu and Al—Si.

13. A method according to claim 11, wherein the step b) is conducted at a first temperature from 450°–500° C.

14. A method according to claim 13, wherein the step d) is conducted under a second temperature equal to the first temperature or more.

15. A method according to claim 11, wherein the annealing process in the step d) is conducted during 120 sec.

16. A method according to claim 11, further comprising the steps of:

e) forming an antireflection layer on the titanium layer to collectively form a laminated wiring; and f) patterning the laminated wiring.

17. A method according to claim 16, wherein the antireflection layer comprises a material selected from a group consisting of TiN and TiON.

18. A method according to claim 17, wherein a thickness of the antireflection layer is about 40 nm.

19. A method of manufacturing a semiconductor device, comprising the steps of:

a) providing a substrate having an insulating layer thereover;

b) forming a hole through the insulating layer;

c) sputtering an aluminum alloy layer on the insulating layer in a vacuum state ambient;

d) after the step c), reflowing the aluminum alloy layer at a first temperature to bury the hole without breaking the vacuum state ambient;

e) forming a titanium layer on the aluminum alloy layer; and f) annealing the substrate to eliminate silicon precipitates which may have been generated during the step d) from the aluminum alloy layer; and g) patterning the aluminum alloy layer from which the silicon precipitates is eliminated, and the titanium layer.

20. A method according to claim 19, wherein the aluminum alloy layer comprises a material selected from a group consisting of Al—Si—Cu and Al—Si.

21. A method according to claim 19, wherein the step d) is conducted at a first temperature from 450°–500° C.

22. A method according to claim 21, wherein the step f) is conducted under a second temperature equal to the first temperature or higher.

23. A method according to claim 19, wherein the reflow process in the step d) is conducted during 120 sec.

24. A method according to claim 19, further comprising the steps of:

e) forming an antireflection layer on the titanium layer to collectively form a laminated wiring; and f) patterning the laminated wiring.

25. A method according to claim 24, wherein the antireflection layer comprises a material selected from a group consisting of TiN and TiON.

26. A method according to claim 25, wherein a thickness of the antireflection layer is about 40 nm.

27. A method according to claim 19, further comprising the steps of:

b-1) prior to step c), forming a first barrier layer over the insulating layer; and b-2) forming a second barrier layer on the first barrier layer.

28. A method according to claim 27, wherein the first barrier layer and the second barrier layer comprise a material selected from a group consisting of Ti and TiON.

29. A method of manufacturing a semiconductor device comprising the steps of:

forming an insulating film covering the surface of a semiconductor substrate having a contact area forming a contact hole in said insulating film at an area corresponding to the contact area of said semiconductor substrate;

forming an Si containing Al alloy layer covering said insulating film and said contact hole, and performing a thermal treatment after or during the formation of said Si containing Al alloy to improve step coverage at said contact hole;

forming a Ti layer on said Al alloy layer after said thermal treatment;

performing another thermal treatment to absorb excessive Si in said Al alloy layer into said Ti layer;

forming an antireflection layer of TiN or TiON on said Ti layer;

forming a mask pattern having a wiring pattern on said antireflection layer by photolithography; and selectively etching a laminate of said antireflection layer, said Ti layer, and said Al alloy layer by using said mask pattern to form a wiring pattern connected to said contact area via said contact hole.

* * * * *